US012571101B2

(12) United States Patent
Bao et al.

(10) Patent No.: US 12,571,101 B2
(45) Date of Patent: Mar. 10, 2026

(54) MULTI-LEVEL INJECTOR WITH ANGLED GAS OUTLET FOR SEMICONDUCTOR EPITAXY GROWTH

(71) Applicant: Applied Materials, Inc., Santa Clara, CA (US)

(72) Inventors: Xinyu Bao, Fremont, CA (US); Shu-Kwan Lau, Sunnyvale, CA (US); Errol Antonio C. Sanchez, Tracy, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 342 days.

(21) Appl. No.: 15/156,371

(22) Filed: May 17, 2016

(65) Prior Publication Data

US 2016/0362813 A1 Dec. 15, 2016

Related U.S. Application Data

(60) Provisional application No. 62/175,046, filed on Jun. 12, 2015.

(51) Int. Cl.
| | |
|---|---|
| *C23C 16/455* | (2006.01) |
| *B05B 1/00* | (2006.01) |
| (Continued) | |

(52) U.S. Cl.
CPC ........ *C23C 16/45563* (2013.01); *B05B 1/005* (2013.01); *C23C 16/455* (2013.01);
(Continued)

(58) Field of Classification Search
CPC ........ C23C 16/45565; C23C 16/45578; C23C 16/45508; C23C 16/45561;
(Continued)

(56) References Cited

U.S. PATENT DOCUMENTS

| | | | | | |
|---|---|---|---|---|---|
| 5,134,965 | A | * | 8/1992 | Tokuda | C23C 16/45502 118/715 |
| 5,522,934 | A | * | 6/1996 | Suzuki | C23C 16/455 118/723 MR |

(Continued)

FOREIGN PATENT DOCUMENTS

| | | |
|---|---|---|
| KR | 100300097 B1 | 11/2001 |
| KR | 10-2006-0076346 A | 7/2006 |

(Continued)

OTHER PUBLICATIONS

Owen, A.J., "The Pyrolysis of Diborane", J. Appl. Chem., 10, Dec. 1960, pp. 483-493.*

(Continued)

*Primary Examiner* — Karl Kurple
(74) *Attorney, Agent, or Firm* — Patterson + Sheridan, LLP

(57) ABSTRACT

A processing chamber with a top, a bottom, and a sidewall coupled together to define an enclosure, a substrate support having a substrate supporting surface, an energy source coupled to the top or the bottom, and a gas injector liner disposed at the sidewall. The gas injector liner comprises a first plurality of gas outlets disposed at a first height, wherein one or more of the first plurality of gas outlets are oriented upwardly or downwardly, a second plurality of gas outlets disposed at a second height shorter than the first height, wherein one or more of the second plurality of gas outlets are oriented upwardly or downwardly, and a third plurality of gas outlets disposed at a third height shorter than the second height, wherein one or more of the third plurality of gas outlets are oriented upwardly or downwardly with respect to the substrate supporting surface.

20 Claims, 8 Drawing Sheets

(51) Int. Cl.

| | | |
|---|---|---|
| *C30B 25/10* | (2006.01) |
| *C30B 29/16* | (2006.01) |
| *H01J 37/32* | (2006.01) |
| *H01L 21/02* | (2006.01) |
| *H05H 1/34* | (2006.01) |
| *C30B 25/14* | (2006.01) |
| *C30B 29/06* | (2006.01) |
| *C30B 29/08* | (2006.01) |
| *C30B 29/40* | (2006.01) |
| *C30B 29/48* | (2006.01) |

(52) U.S. Cl.
CPC .. *C23C 16/45502* (2013.01); *C23C 16/45508* (2013.01); *C23C 16/45561* (2013.01); *C23C 16/45574* (2013.01); *C23C 16/45578* (2013.01); *C23C 16/4558* (2013.01); *C30B 25/105* (2013.01); *C30B 29/16* (2013.01); *H01J 37/3244* (2013.01); *H01J 37/32449* (2013.01); *H01L 21/02293* (2013.01); *H01L 21/02538* (2013.01); *H01L 21/02551* (2013.01); *H05H 1/34* (2013.01); *C30B 25/14* (2013.01); *C30B 29/06* (2013.01); *C30B 29/08* (2013.01); *C30B 29/40* (2013.01); *C30B 29/48* (2013.01); *H01L 21/02532* (2013.01); *H01L 21/0262* (2013.01); *H01L 21/02636* (2013.01)

(58) Field of Classification Search
CPC .......... C23C 16/45563; C23C 16/4558; C23C 16/45558; H01J 37/3244; H01J 37/32449; H05H 1/34
USPC ...................................................... 156/345.33
See application file for complete search history.

(56) References Cited

U.S. PATENT DOCUMENTS

| | | | | | |
|---|---|---|---|---|---|
| 5,525,159 | A * | 6/1996 | Hama | ............... | C23C 16/4404 |
| | | | | | 118/723 I |
| 5,618,349 | A * | 4/1997 | Yuuki | ............... | C23C 16/4412 |
| | | | | | 118/715 |
| 5,851,294 | A * | 12/1998 | Young | ............. | C23C 16/45508 |
| | | | | | 118/715 |
| 6,013,155 | A * | 1/2000 | McMillin | ............ | C23C 16/455 |
| | | | | | 118/723 I |
| RE36,957 | E * | 11/2000 | Brors | ............... | C23C 16/45589 |
| | | | | | 219/390 |
| 6,143,078 | A * | 11/2000 | Ishikawa | .......... | H01L 21/67017 |
| | | | | | 156/345.33 |
| 6,185,839 | B1 * | 2/2001 | Kholodenko | ....... | H01J 37/3244 |
| | | | | | 34/210 |
| 6,270,862 | B1 * | 8/2001 | McMillin | ............ | C23C 16/455 |
| | | | | | 427/569 |
| 6,432,259 | B1 * | 8/2002 | Noorbakhsh | ......... | H01J 37/321 |
| | | | | | 118/723 E |
| 6,486,081 | B1 * | 11/2002 | Ishikawa | ............. | C23C 16/401 |
| | | | | | 438/787 |
| 6,613,189 | B2 * | 9/2003 | Donohoe | ............ | C23C 16/4405 |
| | | | | | 118/723 I |
| 6,626,185 | B2 * | 9/2003 | Demos | ............... | C23C 16/4405 |
| | | | | | 134/1.1 |
| 6,676,760 | B2 * | 1/2004 | Kholodenko | ......... | C23C 16/455 |
| | | | | | 118/715 |
| 6,830,652 | B1 * | 12/2004 | Ohmi | ..................... | C23C 16/24 |
| | | | | | 118/723 MW |
| 6,884,296 | B2 * | 4/2005 | Basceri | ............ | C23C 16/45514 |
| | | | | | 118/715 |
| 6,929,830 | B2 * | 8/2005 | Tei | ................... | C23C 16/45565 |
| | | | | | 118/723 MW |
| 7,303,141 | B2 * | 12/2007 | Han | ................. | C23C 16/45563 |
| | | | | | 239/545 |
| 7,655,111 | B2 * | 2/2010 | Horiguchi | ......... | H01J 37/32192 |
| | | | | | 118/715 |
| 7,722,719 | B2 * | 5/2010 | Lei | ................... | H01J 37/32082 |
| | | | | | 118/715 |
| 7,790,633 | B1 * | 9/2010 | Tarafdar | ........... | H01L 21/02164 |
| | | | | | 257/E21.471 |
| 7,806,078 | B2 * | 10/2010 | Yoshida | ............... | C23C 16/455 |
| | | | | | 118/723 I |
| 8,133,349 | B1 * | 3/2012 | Panagopoulos | ....... | C23C 16/045 |
| | | | | | 156/345.48 |
| 8,137,463 | B2 * | 3/2012 | Liu | ..................... | H01J 37/3244 |
| | | | | | 156/345.33 |
| 8,361,274 | B2 * | 1/2013 | Lee | ..................... | H01L 21/3065 |
| | | | | | 156/345.33 |
| 8,906,249 | B2 * | 12/2014 | Hiroshima | .......... | C23C 16/4558 |
| | | | | | 216/68 |
| 9,245,717 | B2 * | 1/2016 | Kang | ............... | H01L 21/67069 |
| 9,362,137 | B2 * | 6/2016 | Kang | ............... | H01L 21/31058 |
| 9,410,247 | B2 * | 8/2016 | Lee | ................. | C23C 16/45578 |
| 9,460,893 | B2 * | 10/2016 | Kawamata | ........ | H01J 37/32091 |
| 2001/0003271 | A1 * | 6/2001 | Otsuki | ............. | H01J 37/32477 |
| | | | | | 156/914 |
| 2003/0180460 | A1 * | 9/2003 | Strauch | ............. | C23C 16/45568 |
| | | | | | 427/248.1 |
| 2003/0203125 | A1 * | 10/2003 | Tei | .................... | C23C 16/45565 |
| | | | | | 427/575 |
| 2004/0035531 | A1 * | 2/2004 | Donohoe | ............ | C23C 16/4405 |
| | | | | | 156/345.33 |
| 2004/0099378 | A1 * | 5/2004 | Kim | .................... | C23C 16/4558 |
| | | | | | 156/345.33 |
| 2004/0217217 | A1 * | 11/2004 | Han | ................... | C23C 16/4558 |
| | | | | | 239/589 |
| 2005/0150861 | A1 * | 7/2005 | Lee | ..................... | H01L 21/3065 |
| | | | | | 216/2 |
| 2006/0198955 | A1 * | 9/2006 | Zheng | ............... | C23C 16/45546 |
| | | | | | 427/248.1 |
| 2007/0163996 | A1 * | 7/2007 | Horiguchi | ......... | H01J 37/32192 |
| | | | | | 216/67 |
| 2007/0246355 | A1 * | 10/2007 | Toyoda | ............. | H01J 37/32541 |
| | | | | | 204/298.02 |
| 2008/0099450 | A1 * | 5/2008 | Lewington | ........ | H01J 37/32091 |
| | | | | | 219/121.58 |
| 2008/0102202 | A1 * | 5/2008 | Chandrachood | .. | H01J 37/32082 |
| | | | | | 427/248.1 |
| 2009/0165713 | A1 * | 7/2009 | Kim | ................. | C23C 16/45504 |
| | | | | | 118/719 |
| 2010/0089870 | A1 * | 4/2010 | Hiroshima | ............ | C23C 16/507 |
| | | | | | 216/68 |
| 2011/0229637 | A1 * | 9/2011 | Yasui | ................... | C23C 16/407 |
| | | | | | 427/255.4 |
| 2012/0100292 | A1 * | 4/2012 | Park | ................. | C23C 16/45508 |
| | | | | | 427/255.28 |
| 2012/0266819 | A1 * | 10/2012 | Sanchez | ............. | C23C 16/4412 |
| | | | | | 118/719 |
| 2013/0284095 | A1 * | 10/2013 | Ranish | ............. | H01L 21/02104 |
| | | | | | 118/725 |
| 2013/0288460 | A1 * | 10/2013 | Ranish | ............... | H01L 21/0262 |
| | | | | | 438/478 |
| 2014/0137801 | A1 * | 5/2014 | Lau | ......................... | C30B 25/14 |
| | | | | | 118/728 |
| 2016/0097119 | A1 * | 4/2016 | Cui | ................... | C23C 16/45563 |
| | | | | | 134/1.1 |
| 2016/0197001 | A1 * | 7/2016 | Samir | ............... | H01L 21/67115 |
| | | | | | 118/623 |
| 2017/0253971 | A1 * | 9/2017 | Kawamorita | ..... | C23C 16/45551 |

FOREIGN PATENT DOCUMENTS

| | | |
|---|---|---|
| KR | 20060076346 A | 7/2006 |
| KR | 20080039197 A | 5/2008 |
| KR | 10-2010-0015212 A | 2/2010 |
| KR | 20100014501 A | 2/2010 |
| KR | 20100015212 A | 2/2010 |
| KR | 10-2012-0029797 A | 3/2012 |
| KR | 20120029797 A | 3/2012 |

(56)　　　　　References Cited

FOREIGN PATENT DOCUMENTS

| KR | 20150004360 A | 1/2015 |
| TW | 311326 B | 7/1997 |
| TW | 1248108 B | 1/2006 |

OTHER PUBLICATIONS

Jacko, et al. "Pyrolysis of Trimethyl Gallium", Canadian Journal of Chemistry, vol. 41, 1963, pp. 1560-1570.*

International Search Report and Written Opinion for International Application No. PCT/US2016/032859 dated Aug. 26, 2016.

Office Action from Taiwan Patent Application No. 105115483 dated May 6, 2019.

Office Action from Chinese Patent Application No. 201680032685.5 dated Jul. 24, 2019.

Action from Chinese Patent Application No. 201680032685.5 dated Feb. 6, 2020.

Korean Office Action dated May 10, 2023 for Application No. 10-2018-7001136.

Korean Office Action dated Dec. 26, 2023 for Application No. 10-2018-7001136.

* cited by examiner

MULTI-LEVEL INJECTOR WITH ANGLED GAS OUTLET FOR SEMICONDUCTOR EPITAXY GROWTH

CROSS-REFERENCE TO RELATED APPLICATIONS

This application claims benefit of U.S. Provisional Patent Application Ser. No. 62/175,046, filed Jun. 12, 2015 which is herein incorporated by reference in its entirety.

FIELD

Embodiments of the present disclosure generally relate to apparatus for semiconductor processing. More specifically, embodiments described herein relate to apparatus for performing atomic layer epitaxy.

BACKGROUND

Semiconductor substrates are processed for a wide variety of applications, including the fabrication of integrated devices and microdevices. One method of processing substrates includes depositing a material, such as a dielectric material or a conductive metal, on an upper surface of the substrate. For example, epitaxy is a deposition process that grows a thin, ultra-pure layer, usually of silicon or germanium on a surface of a substrate. The material may be deposited in a cross-flow chamber by flowing one or more precursors parallel to the surface of a substrate positioned on a support, and thermally decomposing the precursors to deposit a material from the gas onto the substrate surface.

Precursors are normally injected to the cross-flow chamber in gas phase via side gas injectors and flowed across the substrate. If two or more precursors are used in a deposition process, precursors may not have the same cracking ratio or rate across the substrate because precursors have different pyrolysis or decomposition temperature under a given temperature range and the temperature gradient in the processing volume varies between the substrate and the top dome of the cross-flow chamber. Since the cracking rate of the precursors determines the composition of the compound deposited on the substrate surface, precursors having lower pyrolysis temperature may crack faster than precursors having higher pyrolysis temperature when injecting towards the substrate, resulting in higher concentration of lower pyrolysis temperature precursor at the edge of the substrate and higher concentration of higher pyrolysis temperature precursor at the center of the substrate. Therefore, the compositional uniformity of the film across the substrate is compromised.

Therefore, there is a need for a cross-flow chamber which provides gas injectors with center-to-edge tuning capabilities to improve film quality and deposition uniformity in epitaxy processes.

SUMMARY

Embodiments of the present disclosure provide a processing chamber having a top, a bottom, and a sidewall coupled together to define a volume therein, a substrate support disposed in the volume, the substrate support having a substrate supporting surface, a gas injector disposed at the sidewall, and an energy source coupled to the top or the bottom. The gas injector includes a first plurality of gas outlets disposed at a first height, wherein one or more of the first plurality of gas outlets are oriented at a first angle with respect to the substrate supporting surface, a second plurality of gas outlets disposed at a second height shorter than the first height, wherein one or more of the second plurality of gas outlets are oriented at a second angle with respect to the substrate supporting surface, and a third plurality of gas outlets disposed at a third height shorter than the second height, wherein one or more of the third plurality of gas outlets are oriented at a third angle with respect to the substrate supporting surface.

In another embodiment, the processing chamber comprises a top, a bottom, and a sidewall coupled together to define a volume therein, a substrate support disposed in the volume, the substrate support having a substrate processing surface, a gas injector disposed at the sidewall, and an energy source coupled to the top or the bottom. The gas injector includes a first plurality of gas outlets disposed at a first height, wherein one or more of the first plurality of gas outlets are oriented downwardly at a first angle with respect to the substrate processing surface, a second plurality of gas outlets disposed at a second height shorter than the first height, wherein one or more of the second plurality of gas outlets are oriented downwardly at a second angle with respect to the substrate processing surface, and a third plurality of gas outlets disposed at a third height shorter than the second height, wherein one or more of the third plurality of gas outlets are oriented at a third angle with respect to the substrate supporting surface.

In yet another embodiment, the processing chamber comprises a top, a bottom, and a sidewall coupled together to define a volume therein, a substrate support disposed in the volume, the substrate support having a substrate processing surface, a gas injector disposed at the sidewall, and an energy source coupled to the top or the bottom. The gas injector includes a first plurality of gas outlets disposed at a first height, wherein one or more of the first plurality of gas outlets are oriented upwardly at a first angle with respect to the substrate processing surface, and one or more of the first plurality of gas outlets are oriented downwardly at the first angle with respect to the substrate processing surface, a second plurality of gas outlets disposed at a second height shorter than the first height, wherein one or more of the second plurality of gas outlets are oriented upwardly at a second angle with respect to the substrate processing surface, and one or more of the second plurality of gas outlets are oriented downwardly at the second angle with respect to the substrate processing surface, and a third plurality of gas outlets disposed at a third height shorter than the second height, wherein one or more of the third plurality of gas outlets are oriented upwardly at a third angle with respect to the substrate processing surface, and one or more of the third plurality of gas outlets are oriented downwardly at the third angle with respect to the substrate processing surface.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Implementations of the present disclosure generally relate to an interchangeable side gas injection with multiple levels of gas outlets to separate two or more precursor gases having different pyrolysis temperature. Gas outlets at different levels are oriented at different angles to allow different precursor gases to have substantially the same thermal cracking rate when injecting into the process chamber. The orientation of one or more gas outlets at different heights can be adjusted to flow directional flow of precursor gas(es) towards the center of the substrate, proximate the periphery of the substrate, or spatially distributed on the substrate at any desired location to tune or improve compositional uniformity in the deposited layer or promote a desired flow interaction between different precursor gases. Details of the disclosure and various implementations are discussed below.

Exemplary Chamber Hardware

Figure 1A:
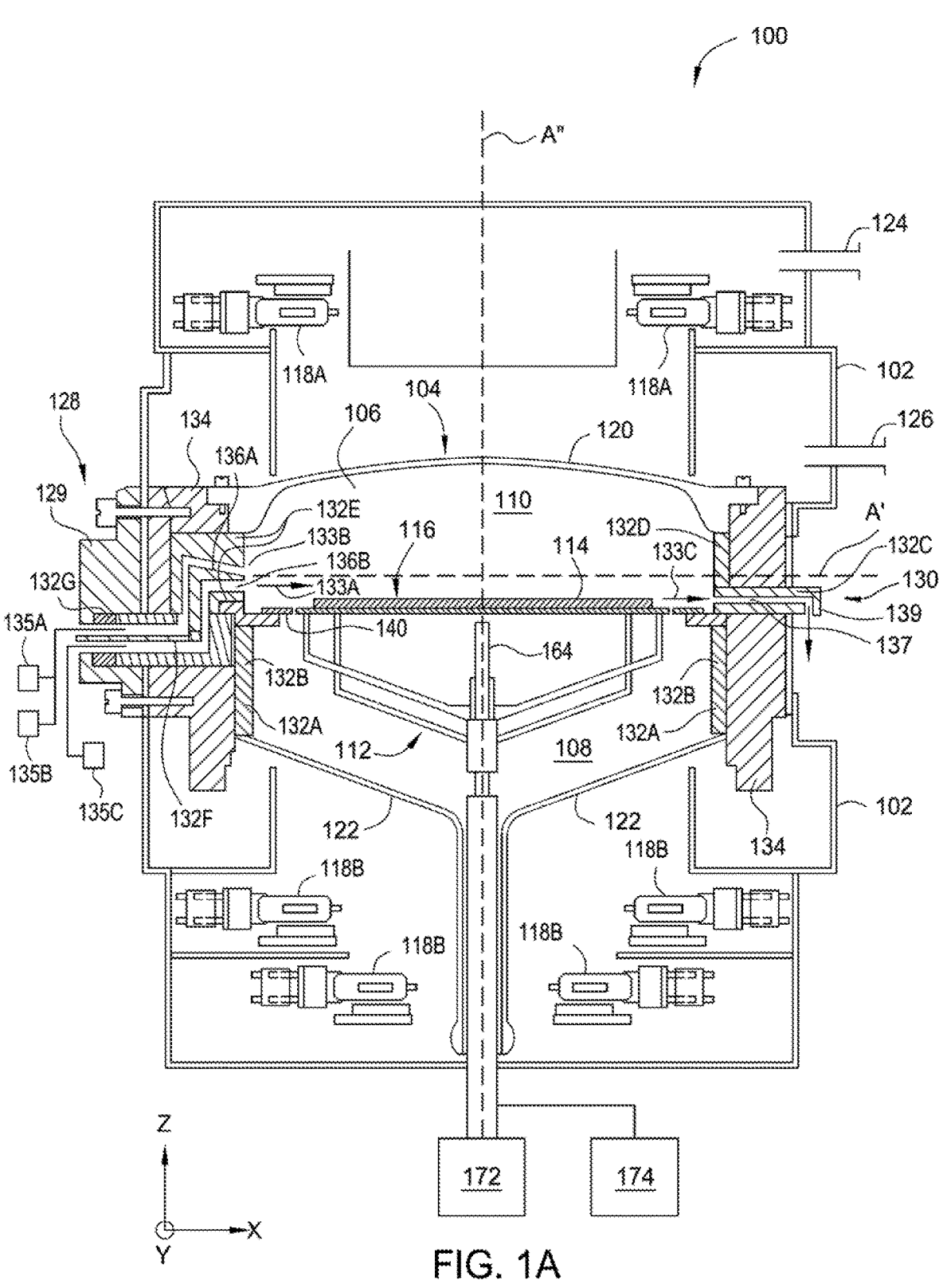
FIG. 1A is a schematic side cross-sectional view of an exemplary process chamber according to one embodiment of the present disclosure.

FIG. 1A is a schematic side cross-sectional view of an exemplary process chamber 100 that may be used to practice various embodiments of the deposition process discussed in this disclosure. The chamber 100 may be utilized for performing chemical vapor deposition, such as epitaxial deposition processes, although the chamber 100 may be utilized for etching or other processes. The chamber 100 includes a housing structure 102 made of a process resistant material, such as aluminum or stainless steel. The housing structure 102 encloses various functioning elements of the process chamber 100, such as a quartz chamber 104, which includes an upper chamber 106, and a lower chamber 108, in which a processing volume 110 is contained. A substrate support 112, made of a ceramic material or a graphite material coated with a silicon material, such as silicon carbide, is adapted to receive a substrate 114 within the quartz chamber 104. The substrate support 112 includes a lift mechanism 172 and a rotation mechanism 174 coupled to the substrate support assembly 164. The lift mechanism 172 can be utilized for moving the substrate support 112 along the central axis "A". The rotation mechanism 174 can be utilized for rotating the substrate support 112 about the central axis "A". Reactive species from precursor reactant materials are applied to a processing surface 116 of the substrate 114, and byproducts may be subsequently removed from the processing surface 116.

Heating of the substrate 114 and/or the processing volume 110 is provided by an energy source, which may be a radiant source or a thermal source. Radiant source may include UV, IR, and visible frequency lamps, lasers, and LEDs, or any combinations thereof. Thermal sources may be lasers, LEDs, and filament lamps, or combinations thereof. In one embodiment shown in FIG. 1A, the energy source is a radiant source using lamps, such as upper lamp modules 118A and/or lower lamp modules 118B. In one example, the upper lamp modules 118A and lower lamp modules 118B are infrared lamps. Radiation from lamp modules 118A and 118B travels through an upper quartz window 120 of upper chamber 106, and through a lower quartz window 122 of lower chamber 108. Cooling gases for upper chamber 106, if needed, enter through an inlet 124 and exit through an outlet 126.

Reactive species are provided to the quartz chamber 104 by a gas distribution assembly 128, and processing byproducts are removed from processing volume 110 by an exhaust assembly 130, which is typically in communication with a vacuum source (not shown). Various embodiments of the gas distribution assembly 128 will be discussed in more detail below with respect to FIGS. 3A-3B to 7A-7B. Precursor reactant materials, as well as diluent, purge and vent gases for the chamber 100, may enter through a gas distribution assembly 128 and exit through the exhaust assembly 130. The process chamber 100 includes multiple liners 132A-132H (only liners 132A-132G are shown in FIG. 1A). The liners 132A-132H shield the processing volume 110 from metallic walls 134 that surround the processing volume 110. In one embodiment, the liners 132A-132H comprise a process kit that covers all metallic components that may be in communication with or otherwise exposed to the processing volume 110.

A lower liner 132A is disposed in the lower chamber 108. An upper liner 132B is disposed at least partially in the lower chamber 108 and is adjacent the lower liner 132A. An exhaust insert liner assembly 132C is disposed adjacent the upper liner 132B. In FIG. 1A, an exhaust insert liner 132D is disposed adjacent the exhaust insert liner assembly 132C and may replace a portion of the upper liner 132B to facilitate installation. An injector liner 132E is shown on the side of the processing volume 110 opposite the exhaust insert liner assembly 132C and the exhaust liner 132D. The injector liner 132E is configured as a manifold to provide one or more fluids, such as a gas or a plasma of a gas, to the processing volume 110. The one or more fluids are provided to the injector liner 132E by an inject insert liner assembly 132F. A baffle liner 132G is coupled to the inject insert liner assembly 132F. The baffle liner 132G is coupled to a first gas source 135A and a second gas source 1356 and provides gases to the inject insert liner assembly 132F and to gas outlets 136A and 1366 formed in the injector liner 132E.

In one embodiment, one or more gases are provided to the processing volume 110 from the first gas source 135A, the second gas source 135B, and the third gas source 135C through the baffle liner 132G, the inject insert liner assembly 132F and through the one or more gas outlets 136A and 136B formed in the injector liner 132E. The one or more gas outlets 136A and 136B formed in the injector liner 132E are coupled to outlets configured for an angled/laminar flow path 133A or 133B. As will be discussed in more detail below, one or more of the gas outlets 136A are angled differently with respect to an axis A' that is in parallel to the substrate surface to tune the film uniformity across the substrate. The gas outlets 136A and 136B are configured to provide individual or multiple gas flows with varied parameters, such as velocity, density, or composition.

In one embodiment where multiple gas outlets 136A and 136B are adapted, the gas outlets 136A and 136B may be distributed along a portion of the circumference of the gas distribution assembly 128 (e.g., injector liner 132E) in a substantial linear arrangement to provide a gas flow that is wide enough to substantially cover the diameter of the substrate. For example, each of the gas outlets 136A and 136B may be arranged to the extent possible in at least one linear group to provide a gas flow generally corresponding to the diameter of the substrate. The gas(es) coming out of the gas outlets 136A are flowed along the flow path 133B which is generally at an angle with respect to an axis A' (substantially normal to a longitudinal axis A" of the chamber 100), and mixed with the gas(es) coming out of the gas outlets 136B. The gases or gas mixture flowing along flow paths 133A, 133B across the entire surface of the substrate and into a plenum 137 in the exhaust liner 132D along an exhaust flow path 133C. The plenum 137 is coupled to an exhaust or vacuum pump (not shown). In one embodiment, the plenum 137 is coupled to a manifold 139 that directs the exhaust flow path 133C in a direction that is substantially parallel to the longitudinal axis A'. At least the inject insert liner assembly 132F may be disposed through and partially supported by an inject cap 129.

Figure 1B:
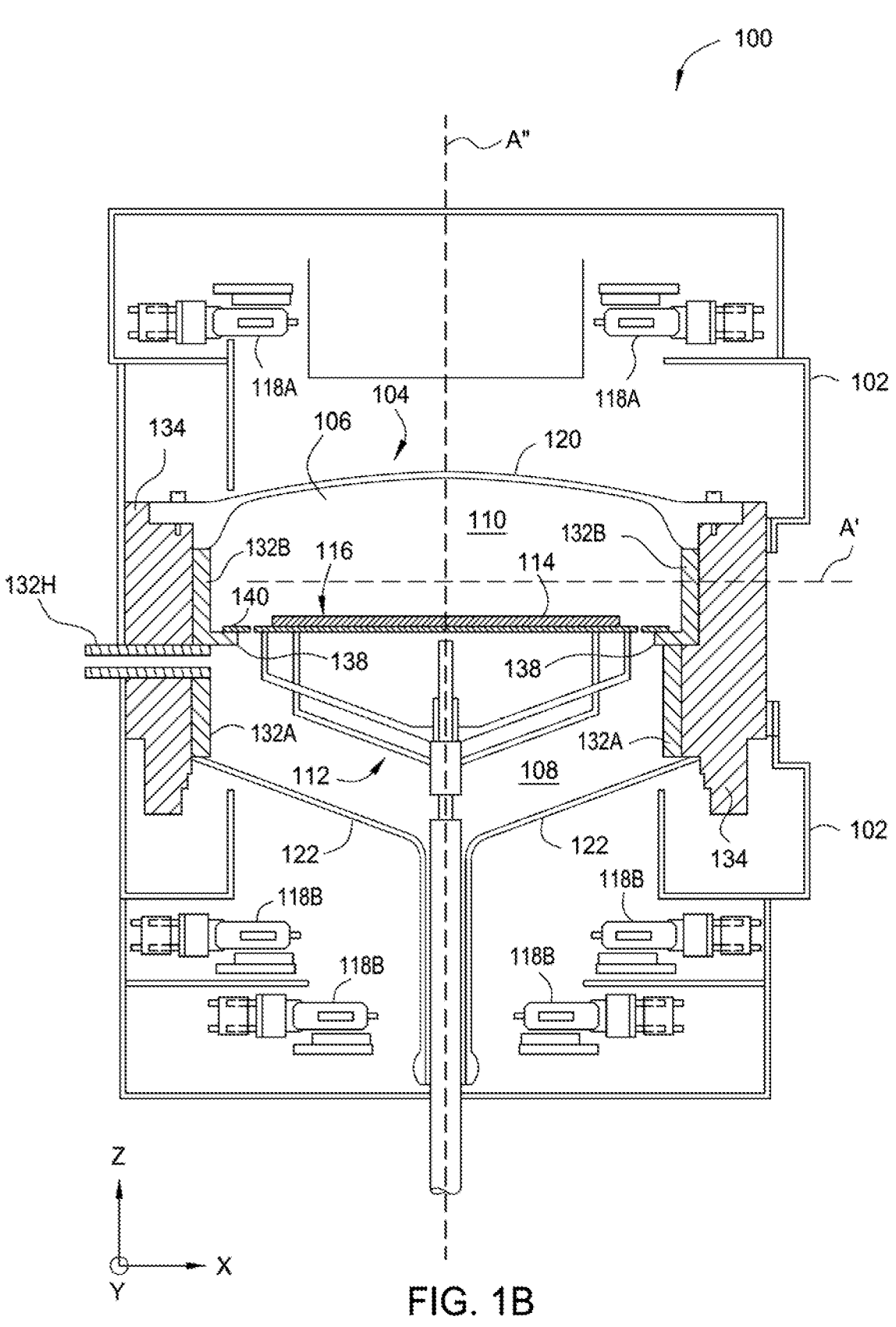
FIG. 1B is a schematic side cross-sectional view of the chamber of FIG. 1A rotated 90 degrees.

FIG. 1B is a schematic side cross-sectional view of the chamber 100 of FIG. 1A rotated 90 degrees. All components that are similar to the chamber 100 described in FIG. 1A will not be described for brevity. In FIG. 1B, a slit valve liner 132H is shown disposed through the metallic walls 134 of the chamber 100. Additionally, in the rotated view shown in FIG. 1B, the upper liner 132B is shown adjacent the lower liner 132A instead of the injector liner 132E shown in FIG. 1A. In the rotated view shown in FIG. 1B, the upper liner 132B is shown adjacent the lower liner 132A on the side of the chamber 100 opposite the slit valve liner 132H, instead of the exhaust liner 132D shown in FIG. 1A. In the rotated view shown in FIG. 1 B, the upper liner 132B covers the metallic walls 134 of the upper chamber 106. The upper liner 132B also includes an inwardly extending shoulder 138. The inwardly extending shoulder 138 forms a lip that supports an annular pre-heat ring 140 that confines precursor gases in the upper chamber 106.

Figure 2:
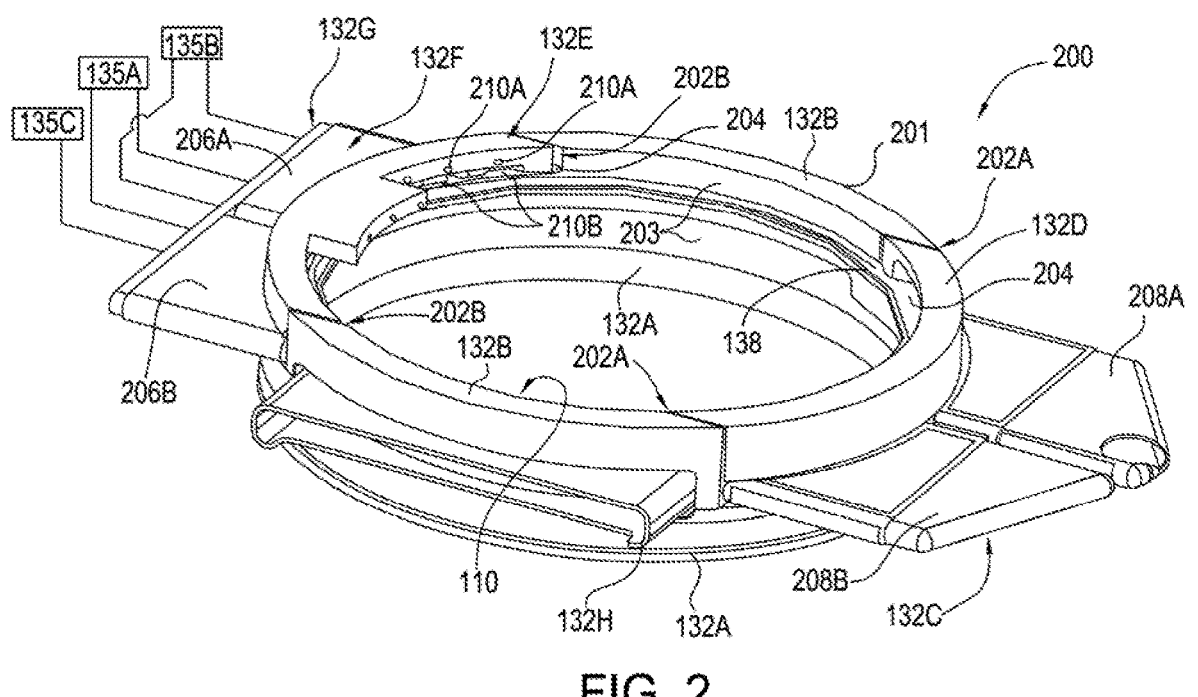
FIG. 2 is an isometric view of one embodiment of a gas process kit comprising one or more liners shown in FIGS. 1A and 1 B.

FIG. 2 is an isometric view of one embodiment of a gas process kit 200 comprising one or more liners 132A-132H as shown in FIGS. 1A and 1B. The liners 132A-132H are modular and are adapted to be replaced singularly or collectively. For example, one or more of the liners 132A-132H may be replaced with another liner that is adapted for a different process without the replacement of other liners 132A-132H. Therefore, the liners 132A-132H facilitate configuring the chamber 100 for different processes without replacement of all of the liners 132A-132H. The process kit 200 comprises a lower liner 132A and an upper liner 132B. Both of the lower liner 132A and the upper liner 132B include a generally cylindrical outer diameter 201 that is sized to be received within the chamber 100 of FIGS. 1A and 1B. Each of the liners 132A-132H may be configured to be supported within the chamber by gravity and/or interlocking devices, such as protrusions and mating recesses formed in or on some of the liners 132A-132H. Interior surfaces 203 of the lower liner 132A and the upper liner 132B form a portion of the processing volume 110. The upper liner 132B includes cut-out portions 202A and 202B sized to receive the exhaust liner 132D and the injector liner 132E, which are shown in cross-section in FIG. 1A. Each of the cut-out portions 202A, 202B define recessed areas 204 of the upper liner 132B adjacent the inwardly extending shoulder 138.

In one embodiment, each of the inject insert liner assembly 132F and the exhaust insert liner assembly 132C may comprise two sections. The inject insert liner assembly 132F includes a first section 206A and a second section 206B that are coupled at one side by the baffle liner 132G. Likewise, the exhaust insert liner assembly 132C includes a first section 208A and a second section 208B. Each of the sections 206A and 206B of the inject insert liner assembly 132F receive gases from the first gas source 135A, the second gas source 135B, and the third gas source 135C through the baffle liner 132G. Greater or fewer gas sources are contemplated.

Gases are flowed through the inject insert liner assembly 132F and routed through a gas distribution manifold liner (not shown) to one or more of first outlets 210A and a plurality of second outlets 210B in the injector liner 132E. In one exemplary example, a first precursor gas from the first gas source 135A is routed to a first set of first outlets 210A, a second precursor gas from the second gas source 135B is routed to a second set of first outlets 210B, and a third precursor gas from the third gas source 135C is routed to one or more of second outlets 210B. In some embodiments, the first outlets 210A are at an angle with respect to the second outlets 210B, as discussed above. In some embodiments, as will be discussed in more detail below with respect to FIGS. 3A and 3B, the first set of first gas outlets 210A may be angled differently from the second set of first outlets 210A in order to control the rate of thermal cracking or decomposition reactions of the precursor gases, and therefore the film uniformity across the substrate.

The injector liner 132E may be installed within a cut-out formed in the upper liner 132B and coupled with the inject insert liner assembly 132F to facilitate gas flow from the inject insert liner assembly 132F to the injector liner 132E. The exhaust liner 132D may be installed above the exhaust insert liner assembly 132C within a cut-out formed in the upper liner 132B opposite the injector liner 132E. In various embodiments, the injector liner 132E may be replaced with another injector liner configured for various different gas flow schemes discussed below with respect to FIGS. 4A-4B to 7A-7B. Likewise, the exhaust insert liner assembly 132C may be replaced with another exhaust insert liner assembly configured for a different exhaust flow scheme.

Exemplary Two Level Gas Outlet with Angled Injection

Figure 3A:
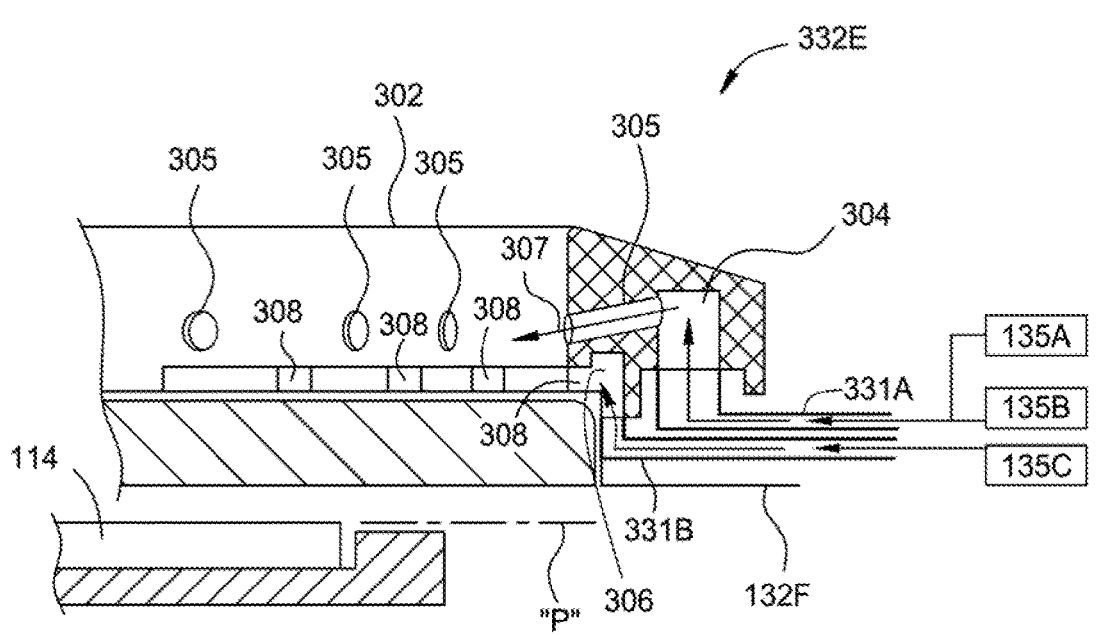
FIG. 3A illustrates a partial perspective cross-sectional view of an injector liner according to one embodiment of the disclosure.

FIG. 3A illustrates a partial perspective cross-sectional view of an injector liner 332E according to one embodiment of the disclosure. The injector liner 332E may be used in place of the injector liner 132E shown in FIGS. 1A, 1B, and 2. Similar to the injector liner 132E shown in FIG. 2, the injector liner 332E has a cylindrical inner diameter that is sized to fit in the cut-outs formed in the upper liner 132B shown in FIG. 1A. The injector liner 332E is generally a partial-cylindrical body 302 having a plurality of first gas channels 304 fluidly connected to a first gas outlet 305, and a plurality of second gas channels 306 fluidly connected to a second gas outlet 308. The first and second gas outlets 305, 308 may be arranged according to any convenient arrangement to provide uniform gas exposure to the substrates on the substrate support 112. In the embodiment of FIG. 3A, the first gas outlets 305 and the second gas channels 306 are arranged in two levels or two rows, with the first gas outlets 305 being disposed at an upper level and the second gas channels 306 being disposed at a lower level. The first gas outlets 305 and the second gas channels 306 are evenly spaced around the circumference and may or may not be in vertical alignment to each other. The first gas channel 304 and the second gas channel 306 are each in fluid communication with one or more gas sources, such as the first gas source 135A, the second gas source 135B, and the third gas source 135C.

The body 302 can be removably combined with the upper liner 132B and coupled with the inject insert liner assembly 132F in a manner discussed above with respect to FIG. 2 to facilitate gas flow from the inject insert liner assembly 132F to the injector liner 332E. In one embodiment, the inject insert liner assembly 132F includes one or more gas passages 331A and 331 B that route precursor gases to the first gas outlets 305 and the second gas outlets 308 of the injector liner 332E, respectively. Each of first and second gas passages 331A, 331 B is fluidly coupled to the corresponding first gas channel 304 and second gas channel 306. The first gas channel 304 may have a longitudinal axis that is substantially orthogonal to the longitudinal axis of the first gas passage 331A. The precursor gases from the first gas source 135A, the second gas source 135B, and the third gas source 135C may remain separated until the gases exit the first gas outlets 305 and the second gas outlets 308.

In one exemplary embodiment, a first precursor gas is flowed from a first gas source 135A through a first set of a plurality of the gas passages 331A into a first set of a plurality of the first gas channels 304, each of which is fluidly connected to respective first gas outlet 305. A second precursor gas is flowed from a second gas source 135B through a second set of a plurality of the gas passages 331A into a second set of a plurality of the first gas channel 304, each of which is fluidly connected to respective first gas outlet 305. A third precursor gas is flowed from a third gas source 135C through the gas passage 331B into the second gas channel 306, each of which is fluidly connected to respective second gas outlet 308. The first, second, and third precursor gases may be, for example, a group III or group V precursor gas, or a suitable purge gas such as any process-compatible inert gas, according to the needs of a particular process. In one exemplary embodiment, the first and second precursor gases may comprise Ga, In, or Al (the first precursor gas may or may not be the same as the second precursor gas), and the third precursor gas may comprise P, As, or Sb. As will be discussed in more detail below, the injector liner 332E has the ability to separate group V precursor gas from two group III precursor gases with different thermal decomposition or pyrolysis temperature, so that different precursor gases have substantially the same thermal cracking rate when injecting into the process chamber.

In various embodiments, the injector liner 332E may have about 6 to about 22 first gas outlets, for example about 8 to about 16 first gas outlets. The number of the second gas outlets may correspond to the number of the first gas outlets. Greater or fewer first and second gas outlets are contemplated depending on the size of the substrate and/or the desired flow rate and/or dispersion rate of a gas in the processing volume 110.

In various embodiments, the injector liner 332E is formed of a material transparent or transmissive to selected wavelengths of energy, and may be made of thermally resistant and chemically resistant material such as quartz (either clear quartz or opaque quartz), sapphire, silicon carbide or graphite coated with silicon carbide, or a combination thereof. If desired, the cylindrical inner surface of the injector liner 332E may be coated with a reflective, refractory, or non-transmissive material, such as gold or a dielectric reflector. An outer surface is opposite the cylindrical inner surface, i.e., interior surface 203.

Figure 3B:
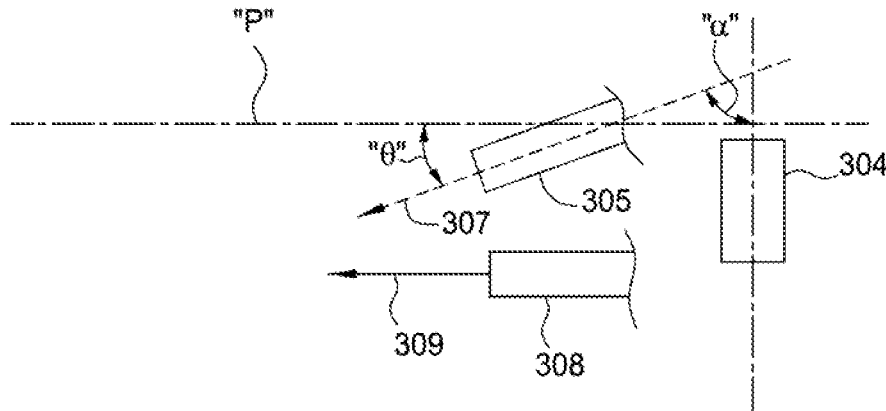
FIG. 3B illustrates an exemplary angular relationship between the gas outlets of the injector liner of FIG. 3A according to one embodiment of the disclosure.

In the embodiment shown in FIG. 3B, each first gas outlet 305 is configured at an angle "$\theta$" with respect to a horizontal plane "P" that is generally parallel to a longitudinal direction of a substrate supporting surface of the substrate support 112, a substrate 114, or the processing surface of the substrate, such that the first precursor gas, after existing the first gas outlet 305, is flowing at an angle along a first direction 307 as shown. The angle "$\theta$" between a longitudinal direction of the first gas outlet 305 and the horizontal plane "P" may be less than about 90°, for example less than 45°, such as from about 5° to about 30°, for example about 15°. The angle "$\theta$" may be adjusted so that the gas is flowing towards the center of the substrate (or substrate support), proximate the periphery of the substrate (or substrate support), or spatially distributed on the substrate (or substrate support) at any desired location. In some cases, the angle "$\theta$" of some of the first gas outlets 305 may be configured to point upwardly towards the upper dome of the process chamber to limit or prevent unwanted deposition or other reactions from occurring, while other first gas outlets 305 are pointed towards the substrate. The first gas outlet 305 may be configured at an angle "$\alpha$" with respect to a longitudinal direction of the first gas channel 304 by about 25° to about 85°, for example about 45° to about 75°. Each opening of the gas outlets disclosed herein terminate at the cylindrical inner surface. For example, each opening of the gas outlets 305, 308 terminate at the interior surface 203.

In one embodiment, some of the first gas outlets 305 may be at an angle different from other first gas outlets 305. For example, the first set of first gas outlets 305 may be at an angle "$\theta$" of about 5° to about 20° while the second set of first gas outlets 305 may be at an angle "$\theta$" of about 20° to about 35°. The first set of first gas outlets 305 may also flow a precursor gas that is different from a precursor gas flowed by the second set of first gas outlets 305, depending on the needs of a particular process. In such a case, the first set of first gas outlets 305, which are at a smaller angle "$\theta$" of about 5° to about 20°, may be used to flow precursor gases having lower pyrolysis temperature (e.g., a group III precursor gas such as Ga), while the second set of first gas outlets 305, which are at a larger angle "$\theta$" of about 20° to about 35°, may be used to flow precursor gases having higher pyrolysis temperature (e.g., a group III precursor gas In). Since the temperature of the process chamber is gradually decreased in a direction away from the substrate surface, the precursor gases having lower pyrolysis temperature and the precursor gases having higher pyrolysis temperature will have a substantially matched cracking rate when injecting towards the substrate, due to the differences in the angled orientation of the first gas outlets 305. The first and second precursor gases are then mixed with the third precursor gas (e.g., a group V precursor gas) from the second gas outlet 308 flowing along a second direction 309. As a result, a uniform composition distribution across the substrate surface is obtained.

If the first gas outlets 305 are configured to have two different injection angles, for example injection angle A and injection angle B, the first gas outlets 305 pointing at the injection angle A may be alternatingly arranged with the other first gas outlets 305 pointing at the injection angle B. It is also contemplated that each of the first and second gas outlets 305, 308 may be configured to provide zoned injection capability. For example, the first gas outlets 305 may be arranged into two or more groups (e.g., three (3) groups) where each group has a predetermined injection angle different from one another pointing to different regions of the substrate, while the second gas outlets 308 may be arranged into two or more groups (e.g., two (2) groups) where each group has a predetermined injection different from one another pointing to different regions of the substrate, or vice versa. Additionally or alternatively, each group may be configured to provide the same precursor gas at different rates, and/or different gases at the same or different rates.

In various embodiments, the height of the first gas outlets 305 (and optionally the height of the second gas outlets 308) may be adjusted according to the injection angle and/or the height difference between the first gas outlets 305 and the second gas outlets 308 so that cracking rate of the precursor gases are substantially matched when injecting toward the substrate. While each height may be set prior to processing the substrate, the substrate support may be vertically moved prior to or during the processing to dynamically adjust the height of the one or more first gas outlets 305 with respect to the substrate.

It is contemplated that the flow rate and/or duration in the embodiments of this disclosure may be independently controlled for each first and second gas outlets 305, 308. For example, some or all of the first gas outlets 305 may be idle or pulsed during processing to achieve a desired flow interaction with a second precursor gas flowing from the second gas outlets 308. Additionally or alternatively, the same precursor gas may be provided at different flow rates to the substrate, or different regions of the substrate.

Exemplary Three Level Gas Outlet with Angled Injection

As discussed above, the temperature of the process chamber is gradually decreased in a direction away from the substrate surface. Since different precursors have different thermal decomposition or pyrolysis temperatures and the rate of thermal cracking reactions determines the composition of the compound and the physical/electrical properties of the material layers on the substrate, it will be advantageous to have different precursor gases thermally cracked at the same rate when injecting into the process chamber to ensure compositional uniformity of the deposited layer across the substrate surface. In order to enhance a matched cracking profile between different precursor gases, FIGS. 4 to 7A-7B illustrate various injector liner designs to direct gas flow in desired ways to tune or improve compositional uniformity in the deposited layer, or to promote a desired flow interaction between different precursor gases from the gas outlets. Particularly, these designs feature multiple levels of side gas injection with various zone-controlled flowing schemes, which are beneficial especially when three or more precursor gases with different thermal decomposition or pyrolysis temperatures are used in the process.

Figure 4A:
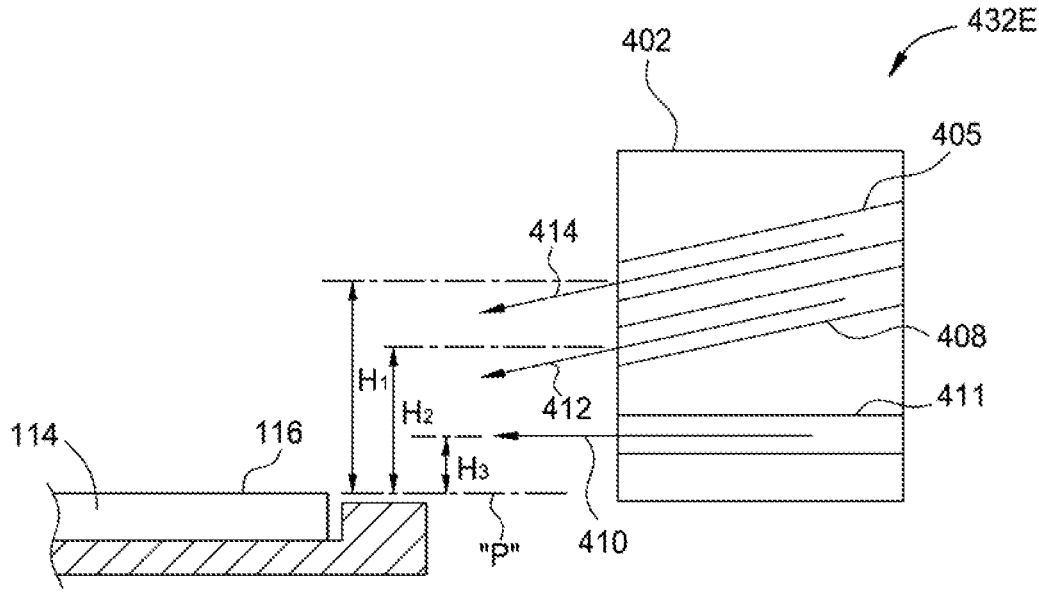
FIG. 4A is a schematic cross-sectional view of a portion of an injector liner according to one embodiment of the present disclosure.

FIG. 4A is a schematic cross-sectional view of a portion of an injector liner 432E according to one embodiment of the present disclosure. The injector liner 432E may be used in place of the injector liner 132E shown in FIGS. 1A, 1B, and 2. The injector liner 432E is similar to the injector liner 332E with a few differences in the levels of the gas outlets and configuration thereof. The injector liner 432E is generally a partial-cylindrical body 402 having a cylindrical inner diameter that is sized to fit in the cut-outs formed in the upper liner 132B (FIG. 2). The injector liner 432E has a plurality of first gas outlets 405, a plurality of second gas outlets 408, and a plurality of third gas outlets 411. In one embodiment, which can be combined with other embodiments described herein, the first, second, and third gas outlets 405, 408, 411 are distributed around a circumference of the injector liner 432E and/or along a longitudinal axis of the injector liner 432E.

While not shown, it is contemplated that each of the plurality of first, second, and third gas outlets 405, 408, 411 are in fluid communication with a respective gas source in a similar way discussed above with respect to FIG. 3A. For example, once the injector liner 432E has been installed within the cut-out formed in the upper liner 132B and coupled with the inject insert liner assembly 132F (FIG. 2), each of the plurality of first, second, and third gas outlets 405, 408, 411 can be in fluid communication with the first gas source 135A, the second gas source 135B, and the third gas source 135C of FIG. 3A via respective gas passage and gas channel, e.g., first and second gas passages 331A, 331B and corresponding first gas channel 304 and second gas channel 306 of FIG. 3A. One or more of the first and second gas passages 331A, 331B and corresponding first and second gas channels 304, 306 may be used for routing the third gas from the third gas source 135C. Alternatively, one or more third gas passages and corresponding third gas channels may be used to route the precursor gas from the third gas source 135C to the third gas outlets 405.

In the embodiment of FIG. 4A, which can be combined with other embodiments described herein, the injector liner 432E is in a three level arrangement. That is, the first gas outlets 405 are disposed at about a first height "$H_1$", the second gas outlets 408 are disposed at about a second height "$H_2$", and the third gas outlets 411 are disposed at about a third height "$H_3$", in which the first height "$H_1$" is greater than the second height "$H_2$", and the second height "$H_2$" is greater than the third height "$H_3$". The height described herein may refer to a distance between the opening of the gas outlets and the elevation of the processing surface 116 of the substrate 114. The first, second, and third heights may be adjustable, for example, by selecting a desired injector liner with gas outlets set at different heights prior to processing the substrate in the process chamber, or by vertically moving the substrate support with respect to the processing surface of the substrate to adjust the first, second, and third height.

In various embodiments, the injector liner 432E is formed of a material transparent or transmissive to selected wavelengths of energy, and may be made of thermally resistant and chemically resistant material such as quartz (either clear quartz or opaque quartz), sapphire, silicon carbide or graphite coated with silicon carbide, or a combination thereof. If desired, the cylindrical inner surface of the injector liner 432E may be coated with a reflective, refractory, or non-transmissive material, such as gold or a dielectric reflector The first, second, and third gas outlets 405, 408, 411 may be configured to flow any suitable precursor gas(es) depending on the needs of the application. For example, the third gas outlets 411 at the third height may flow a group V containing precursor gas and the first and second gas outlets 405, 408 at the first and second heights may each flow a group III containing precursor gas (where the first and second gas outlets 405, 408 may or may not flow the same precursor gas). In one exemplary embodiment, one or more first gas outlets 405 are configured to flow a group III containing precursor gas with lower thermal decomposition or pyrolysis temperature, while one or more second gas outlets 408 are configured to flow a group III containing precursor gas with higher thermal decomposition or pyrolysis temperature. It is contemplated that precursor gas may be any material systems other than III-V, such as the II-VI material system. Any desired dopant gas may also be used, depending upon the needs of specific processes.

In embodiments where a selective epitaxial growth process is desired, one or more third gas outlets 411 at the third height may flow a first process gas and the first and second gas outlets 405, 408 at the first and second heights may each flow a second process gas. The first process gas may comprise one or more process gases. For example, the first process gas may include one or more deposition gases, and optionally, one or more of a dopant precursor gas, an etchant gas, or a carrier gas. The deposition gas may include, for example, a silicon precursor such as silanes, halogenated silanes, or combinations thereof. Silanes may include silane ($SiH_4$) and higher silanes with the empirical formula $Si_xH_{(2x+2)}$, such as disilane ($Si_2H_6$), trisilane ($Si_3H_8$), and tetrasilane ($Si_4H_{10}$). Halogenated silanes may include monochlorosilane (MCS), dichlorosilane (DCS), trichlorosilane (TCS), hexachlorodisilane (HODS), octachlorotrisilane (OCTS), silicon tetrachloride (STC), or a combination thereof. The dopant precursor gas may include, for example, phosphorous, boron, arsenic, gallium, or aluminum, depending upon the desired conductive characteristic of the deposited epitaxial layer. The etchant gas may include, for example methane ($CH_3$) or any gas containing halogen molecules such as hydrogen chloride (HCl), chlorine ($Cl_2$), or hydrogen fluoride (HF). The carrier gas may include, for example, nitrogen ($N_2$), argon (Ar), helium (He), or hydrogen ($H_2$).

The second process gas may be the same or different from the first process gas. The second process gas may include any or all combinations of those gases discussed above for the first process gas (e.g., combinations of the deposition gases, etchant gases, dopant precursor gases, and carrier gases). The second process gas may be flowed alternately, periodically, partially concurrently, or concurrently with the first process gas. In some embodiments, the second process gas may be flowed at the same time with the first process gas. In some embodiments, the first and second gas outlets 405, 408 at the first and second heights may flow the second process gas different from one another. In some embodiments, the gas injectors 405, 408 at second and third heights may be configured to provide the same precursor gas at different rates, and/or different precursor gases at the same or different rates.

The concept described in embodiments of the present disclosure is also applicable to epitaxy process for forming other materials. Some example may include undoped silicon, SiGe/SiGe:B, Si:CP, pure Ge, GeSn, GeP, GeB, or GeSnB, etc., which may be used in logic and memory applications. In such cases, possible silicon precursors may be the same as those described above, and possible germanium precursors may include, but are not limited to $GeH_4$ and $Ge_2H_6$. Examples of halogenated germanium that may be used may include, but are not limited to $GeCl_4$, $GeHCl_3$, $Ge_2Cl_6$, $Ge_3Cl_8$, etc.

Figure 4B:
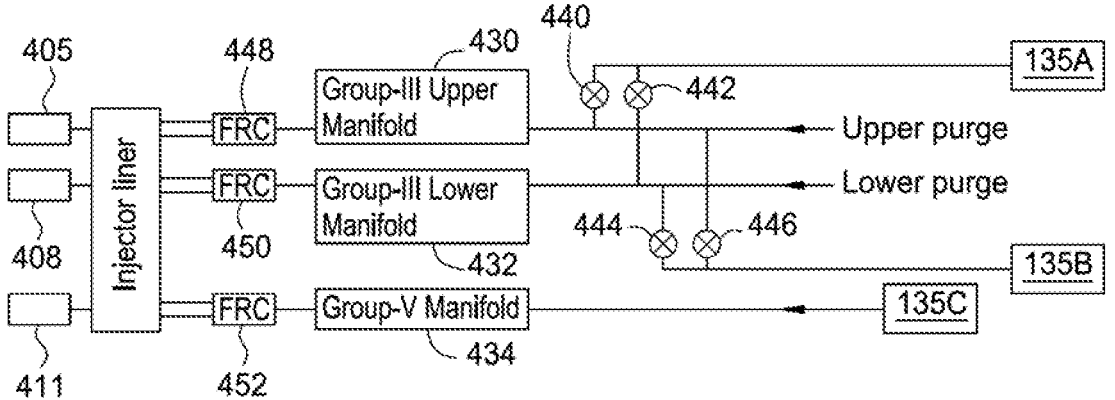
FIG. 4B illustrates an exemplary gas manifold system that may be used to practice embodiments of FIG. 4A.

One or more gas manifolds may be used for one or more of first, second and third gas outlets to enable the capability of depositing group III-V or II-VI semiconductor alloys in the form of binary, ternary, and quaternary compounds. FIG. 4B illustrates an exemplary gas manifold system that may be used to practice embodiments of FIG. 4A, or other embodiments of this disclosure. In the embodiment of FIG. 4B, the first gas outlets 405, the second gas outlets 408, and the third gas outlets 411 are in fluid communication with the first gas source 135A, the second gas source 135B, and the third gas source 135C, respectively. The first precursor gas (e.g., a group III containing precursor gas) from the first gas source 135A may be routed to the first gas outlets 405 and/or the second gas outlets 408 through a first manifold 430 and/or a second manifold 432 by controlling a first valve 440 and/or a second valve 442. Similarly, the second precursor gas (e.g., a group III containing precursor gas different from the first precursor gas) from the second gas source 135B may be routed to the first gas outlets 405 and/or the second gas outlets 408 through the first manifold 430 and/or the second manifold 432 by controlling a third valve 444 and/or a fourth valve 446. The third precursor gas (e.g., a group V containing precursor gas) from the third gas source 135C may be routed to the third gas outlets 411 through a third manifold 434. Other configurations are contemplated. For example, the first, second, and third manifolds and/or gas sources can be exchanged.

The first or second precursor gas may flow to the first or second manifold 430, 432 by opening/closing the valves 440-446 accordingly depending on the thermal properties of the precursor gas. For example, if the first precursor gas has a lower pyrolysis temperature than the second precursor gas, the first precursor gas may flow to the first manifold 430 by opening the valve 440 and closing the valve 442 to route the first precursor gas to the first gas outlets 405. The second precursor gas having a higher pyrolysis temperature than the first precursor gas may flow to the second manifold 432 by opening the valve 444 and closing the valve 446 to route the second precursor gas to the second gas outlets 408. The first or second precursor gas may be pushed to any of first and second gas outlets 405, 408 by a purge gas, such as a hydrogen gas. Similarly, the third precursor gas may be pushed to the third gas outlets 411 by a purge gas. If the first precursor gas and the second precursor gas have the same or similar pyrolysis temperature, both precursor gases may flow to the first manifold 430 or the second manifold 432, depending on the process needs.

In one embodiment, a first flow ratio controller (FRC) 448 is provided between the first manifold 430 and the first gas outlets 405, a second FRC 450 is provided between the second manifold 432 and the second gas outlets 408, and a third FRC 452 is provided between the third manifold 434 and the third gas outlets 411. Each of the flow ratio controllers may be configured to split gas flow to inner and outer regions of the injector liner, thereby making the gas distribution more uniform across the surface of the substrate.

Referring back to FIG. 4A, one or more of the first, second, and third gas outlets 405, 408, and 411 may be oriented at any predetermined angle with respect to each other, or with respect to the processing surface 116 of the substrate 114 to direct gas(es) in any desired direction to produce a directional gas flow. In the embodiment of FIG. 4A, the third gas outlets 411 at the third height are disposed in parallel to the processing surface 116 of the substrate 114 so that the precursor gas from the third gas outlets 411 flows in a direction 410 (substantially parallel to the processing surface 116 of the substrate 114) and across the processing surface 116 towards the exhaust. In some embodiments, one or more third gas outlets 411 at the third height may be oriented downwardly or upwardly at an angle with respect to the processing surface 116 of the substrate 114. In such a case, the longitudinal axis of the third gas outlets 411 may be at an angle of about 5° to about 30° with respect to the processing surface 116 of the substrate 114. Since the third gas outlets 411 are disposed at a position closer to the substrate processing surface (and thus are exposed to higher processing temperature), the third gas outlets 411 may be used to flow precursor gases with higher thermal decomposition or pyrolysis temperature.

In one embodiment, which can be combined with other embodiments described herein, one or more, or all of the first gas outlets 405 at the first height may be oriented at an angle with respect to a horizontal plane "P" parallel to the processing surface 116 of the substrate 114. In such a case, the longitudinal axis of the first gas outlet 405 at the first height is at an angle of about 1° to about 35° with respect to the horizontal plane "P", for example about 5° to about 25°. The chosen angle should enable a desired flow interaction between the precursor gas(es) from the first gas outlets 405 flowing in a direction 414 and the precursor gas(es) from the second gas outlets 408 flowing in a direction 412 as well as the precursor gas(es) from the third gas outlets 411 flowing in a direction 410.

In one embodiment, which can be combined with other embodiments described herein, one or more, or all of the second gas outlets 408 at the second height are oriented at an angle with respect to the horizontal plane "P" parallel to the processing surface 116 of the substrate 114. In such a case, the longitudinal axis of the second gas outlet 408 at the second height are at an angle of about 1° to about 35° with respect to the horizontal plane "P", for example about 5° to about 25°. The chosen angle should enable a desired flow interaction between the precursor gas(es) from the second gas outlets 408 flowing in a direction 412 and the precursor gas(es) from the first gas outlets 405 flowing in a direction 414 as well as the precursor gas(es) from the third gas outlets 411 flowing in a direction 410.

Figure 5A:
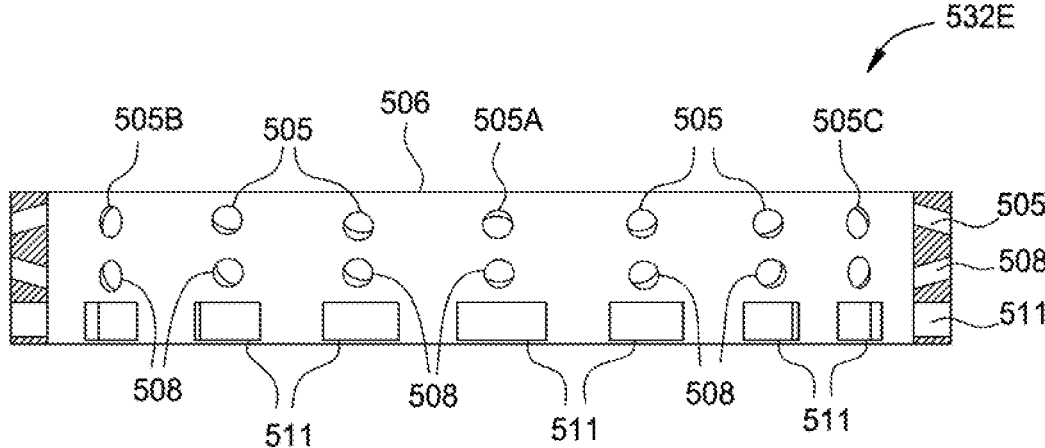
FIG. 5A is a partial cross-sectional view of the side surface of an injector liner according to one embodiment of the present disclosure.

In one embodiment, which can be combined with other embodiments described herein, the longitudinal axis of one or more first gas outlets at the first height is at an angle different from the longitudinal axis of one or more, or all of second gas outlets at the second height. FIG. 5A is a partial cross-sectional view of the side surface of an injector liner 532E showing certain first gas outlets 505 are oriented upwardly towards a top edge 506 of the injector liner 532E (i.e., a direction away from the substrate processing surface), while other first gas outlets 505 and the second gas outlets 508 are oriented downwardly according to one embodiment of the present disclosure. In one embodiment of FIG. 5, the first gas outlets 505A, 505B, 505C at the first height are angled upwardly, for example, oriented towards the upper quartz window 120 of the process chamber 100 shown in FIG. 1. This configuration may allow first gas outlets 505A, 505B, 505C to provide a precursor gas, such as a purge gas, towards the upper quartz window 120 for cleaning purposes, while the rest of the first gas outlets 505 and the second gas outlets 508 are oriented downwardly at an angle with respect to the processing surface of the substrate (not shown) to provide precursor gas(es) interacting with the precursor gases from the third gas outlets 511. In one exemplary embodiment shown in FIG. 5B, the longitudinal axis of first gas outlets 505A, 505B, 505C is oriented upwardly at an angle "A" with respect to the a horizontal plane "P" parallel to the processing surface of the substrate. The angle "A" has an absolute value of about 1° to about 45°, for example about 15° to about 30°. The longitudinal axis of the rest of the first gas outlets 505 (not shown) and the longitudinal axis of one or more second gas outlets 508 are oriented downwardly at an angle "B" with respect to the horizontal plane "P" of the substrate. The angle "B" has an absolute value of about 1° to about 45°, for example about 5° to about 30°. The longitudinal axis of one or more third gas outlets 511 is oriented in parallel to the horizontal plane "P" of the substrate such that an angle of the one or more third gas outlets 511 has an absolute value of about 0°.

Figure 5B:
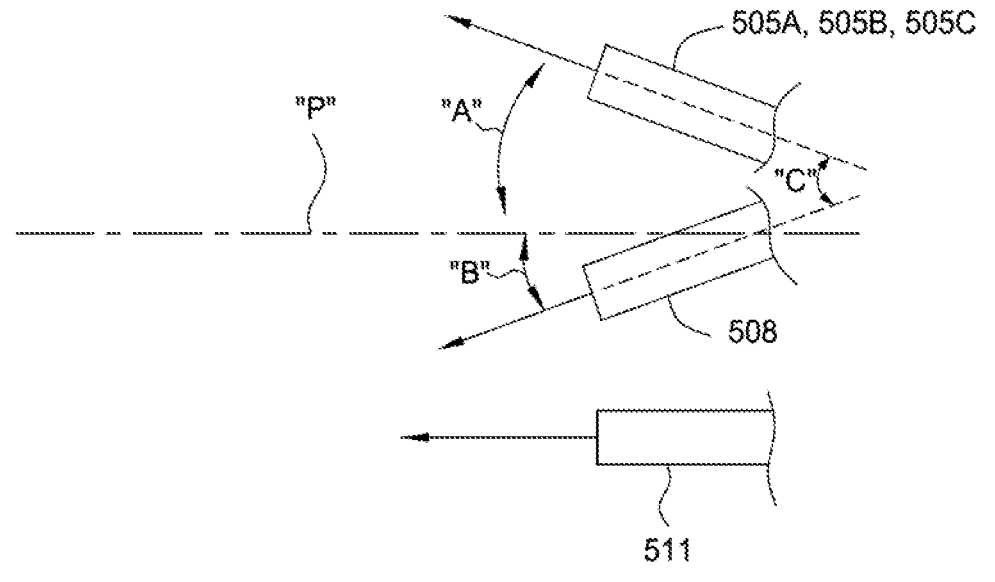
FIG. 5B illustrates an exemplary angular relationship between the gas outlets of the injector liner of FIG. 5A according to one embodiment of the disclosure.
Figure 5C:
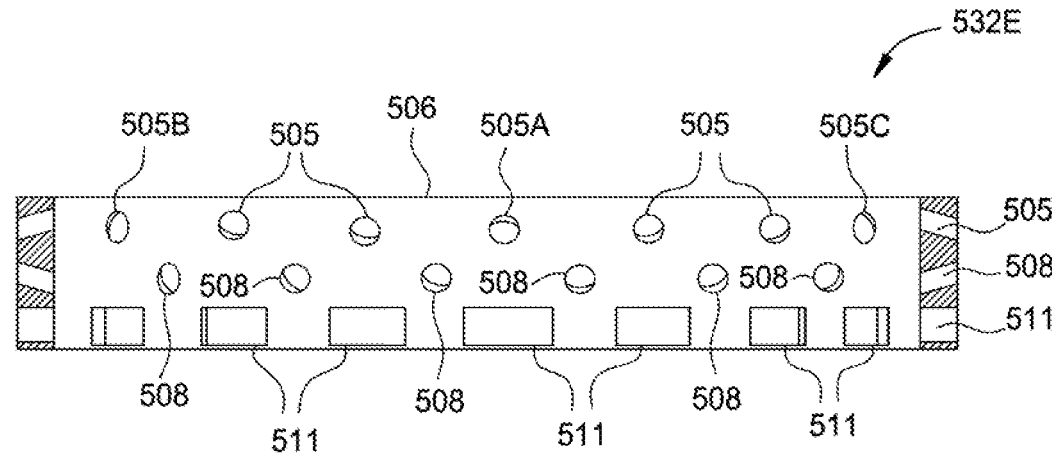
FIG. 5C is a partial cross-sectional view of the side surface of an injector liner according to one embodiment of the present disclosure.

In one embodiment, which can be combined with other embodiments described herein, the longitudinal axis of one or more first gas outlets 505 at the first height is at an angle different from the longitudinal axis of one or more second gas outlets 508 at the second height. For example, the longitudinal axis of one or more first gas outlets 505 may be at an angle "C" with respect to the longitudinal axis of one or more second gas outlets 508. Such angle "C" is between about 1° and about 35°, for example about 5° to about 15°. In some examples of this embodiment, the longitudinal axis of one or more first gas outlets 505 at the first height is at an angle with respect to the longitudinal axis of one or more second gas outlets 508 at the second height, while the longitudinal axis of one or more first gas outlets 505 at the first height is arranged in parallel to the longitudinal axis of one or more second gas outlets 508 at the second height. As another example and as shown in FIGS. 5A-5C, an angle of the one or more third gas outlets 511 has an absolute value that is less than an absolute value of the angle "A" of the one or more first gas outlets 505.

In one embodiment, which can be combined with other embodiments described herein, the longitudinal axis of one or more first gas outlets 505 at the first height is at an angle different from the longitudinal axis of one or more second gas outlets 508 at the second height. For example, the longitudinal axis of one or more first gas outlets 505 may be at an angle "C" with respect to the longitudinal axis of one or more second gas outlets 508. Such angle "C" is between about 1° and about 35°, for example about 5° to about 15°. In some examples of this embodiment, the longitudinal axis of one or more first gas outlets 505 at the first height is at an angle with respect to the longitudinal axis of one or more second gas outlets 508 at the second height, while the longitudinal axis of one or more first gas outlets 505 at the first height is arranged in parallel to the longitudinal axis of one or more second gas outlets 508 at the second height.

In one embodiment, which can be combined with other embodiments described herein, the first gas outlets 505, the second gas outlets 508, and the third gas outlets 511 are in vertical alignment to each other (e.g., stacked atop each other) as shown in FIG. 5A. Alternatively, the first gas outlets 505, the second gas outlets 508, or the third gas outlets 511 are vertically offset from each other. For example, the second gas outlets 508 may be staggered by half-pitch from the first gas outlets 505 and third gas outlets 511, respectively, as shown in FIG. 5C.

In one embodiment, which can be combined with other embodiments described herein, each of the first gas outlets 505, the second gas outlets 508, and the third gas outlets 511 are configured to provide a plurality of independent zones for flowing precursor gases towards the processing surface of the substrate or any desired region within the process chamber. In one example, the first gas outlets 505 are configured to provide two or more independent zones, for example three independent zones. The second gas outlets 508 are configured to provide two or more independent zones, for example three independent zones. The third gas outlets 511 are configured to provide two or more independent zones, for example three independent zones. One or more, or all of the first, second, and third gas outlets 505, 508, 511 in each independent zone are oriented at any desired angle with respect to the horizontal plane "P" of the substrate in a manner as discussed in various embodiments of this disclosure. Gas outlets in each independent zone at a first height may flow a directional flow of precursor gases similarly or different from gas outlets in each independent zone at a second or third height. Additionally or alternatively, each of the first gas outlets 505, the second gas outlets 508, and the third gas outlets 511 may be configured to provide azimuthal and radial distribution control of the precursor gas(es). For example, each independent zone may be separated from an immediate adjacent independent zone by an azimuthal angle of about 1° to about 25°, for example about 5° to about 10°.

Additionally or alternatively, one or more, or all of the first, second, and third gas outlets 505, 508, 511 in each independent zone may be oriented so that a directional gas flow of the precursor gas(es) is provided at the center of the substrate (or substrate support), proximate the periphery of the substrate (or substrate support), any desired location between the center and the periphery of the substrate (or substrate support), or any desired location within the process chamber such as the upper quartz window 120, depending upon the particular needs of the application.

It is contemplated that any number of gas outlet openings and any number of rows of gas outlets discussed in this disclosure may be provided in the injector liner 532E, depending on the needs for particular implementations. It is also contemplated that the injector liner 532E may have a constant density, or a varying density of gas outlets 505 (including gas outlets 505A, 505B, 505C), 508, and 510 along the circumference of the injector liner 532E. The gas outlets 505 (including gas outlets 505A, 505B, 505C), 508, and 510 are sized, depending on the total number of the gas outlets 505, 508, and 510, to provide a desired gas flow(s). In an exemplary embodiment, the gas outlets 505, 508, and 510 have a diameter between about 2 mm and about 2 cm, such as between about 5 mm and about 1 cm, for example about 7 mm.

In addition, while a three-level gas injection is shown and discussed, the design features described in this disclosure can be combined and/or multiply to provide multiple levels of side gas injection, for example a four-level, a five-level, or X-level (where X may be 6 to 50, for example 10 to 30, or any other number depending upon the desired application), thereby providing a multiple level side gas injection with various zone-controlled flowing schemes as described in this disclosure, which are beneficial especially when three or more precursor gases with different thermal decomposition or pyrolysis temperatures are used in the process.

Figure 6:
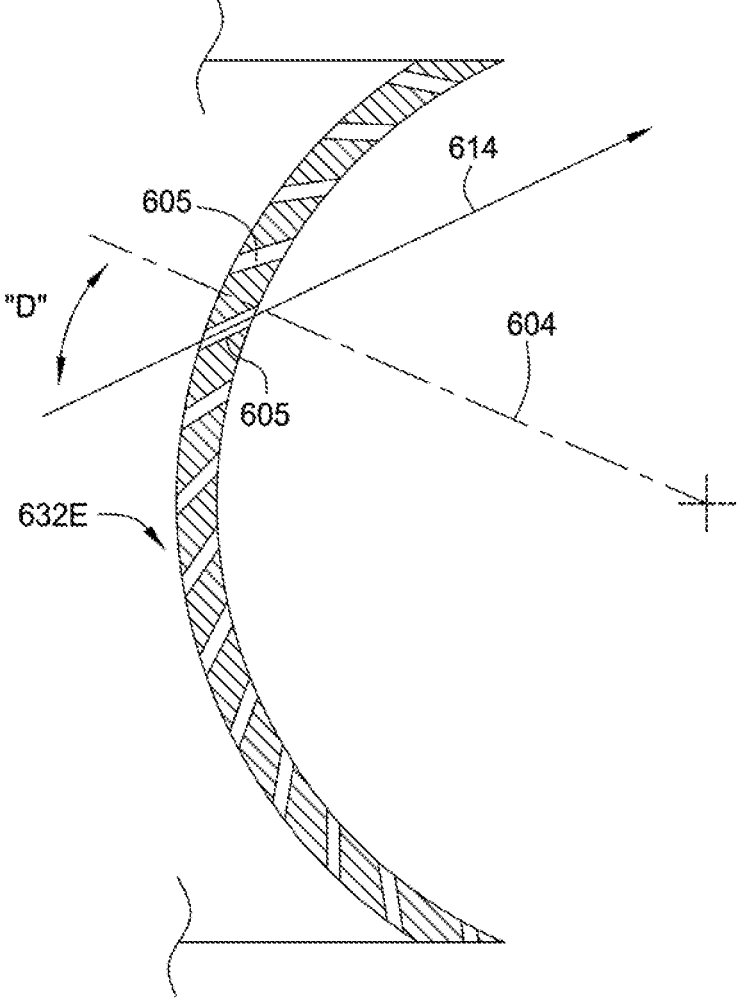
FIG. 6 illustrates a top cross-sectional view of an injector liner according to one embodiment of the present disclosure.

In one embodiment, which can be combined with other embodiments described herein, the injector liner may have any one or more of the first gas outlets, the second gas outlets, and/or the third gas outlets configured to form an angle with respect to a radius of the injector liner. FIG. 6 illustrates a top cross-sectional view of an injector liner

632E according to one embodiment of the present disclosure. The injector liner 632E has a plurality of first gas outlets 605 that form an angle "D" of about 5° to about 35° with respect to a radius 604 of the injector liner 632E. The first gas outlets 605 thus provide a rotational flow of gas(es) flowing in a direction 614 into the processing volume 110 of the process chamber 100. Depending on the chosen angle "D", the rotational flow of gas(es) may be flowed tangentially across the substrate, delivered from above the substrate, or combinations thereof, to achieve any desirable spatial configuration of the one or more precursor gases to the substrate, such as towards the center of the substrate, proximate the periphery of the substrate (or substrate support), or spatially distributed on the substrate (or substrate support) in any desirable location. The rotational flow of gas(es) provided by the first gas outlets 605 is imparted to other precursor gas(es) flowing into the processing volume to tune or improve compositional uniformity in the deposited layer, or to promote a desired flow interaction between different precursor gases from other gas outlets. The rotational or tangential flow of gas(es) is also used to complement, cancel, or otherwise interact with rotation of the substrate support to improve processing uniformity in some cases. While only the first gas outlets 605 are shown, it is contemplated that one or more of second gas outlets and/or one or more of third gas outlets are configured similarly to provide a desired flow of gas(es). It is also contemplated that the angling of FIG. 6 may be combined in any desired way with the angle orientation of FIGS. 3, 4, and 5A-5C.

Figure 7A:
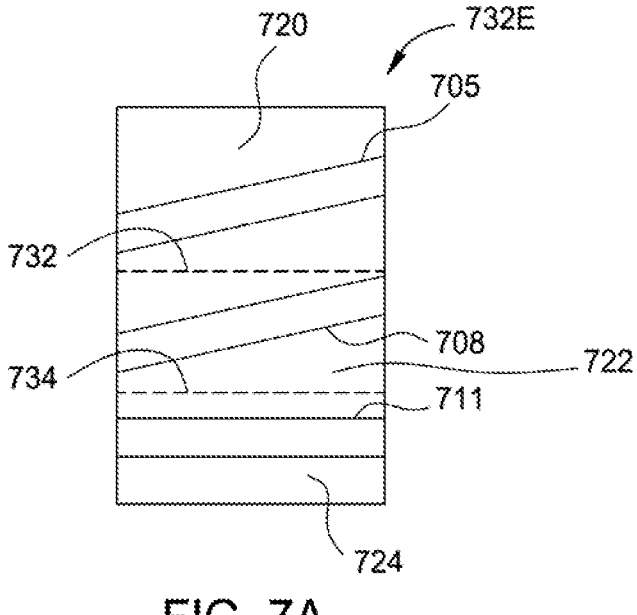
FIG. 7A is a schematic cross-sectional view of a portion of an injector liner according to one embodiment of the present disclosure.
Figure 7B:
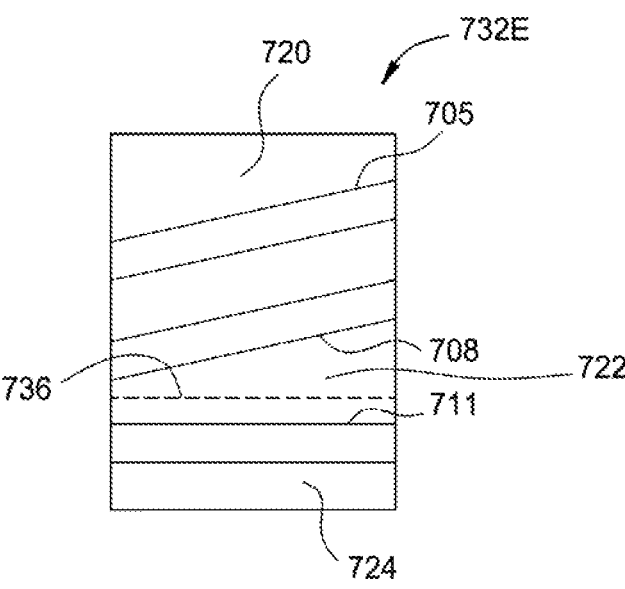
FIG. 7B is a schematic cross-sectional view of a portion of an injector liner according to one embodiment of the present disclosure To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

In various embodiments of this disclosure, the injector liner is formed as an integrated part including multiple levels or rows of the gas outlets, or may be multiple pieces stacking or bounding together. Taking FIG. 4A as an example, the injector liner 432E is formed as an integrated part having three levels of gas outlets 405, 408, 411 formed in the partial-cylindrical body 402. In an alternative embodiment as shown in FIG. 7A, which can be combined with other embodiments described herein, the injector liner 732E is formed of three blocks 720, 722, 724. In such a case, the first block 720 having a plurality of first gas outlets 705 rests on the second block 722 having a plurality of second gas outlets 708 by gravity, and the second block 722 having a plurality of second gas outlets 708 rests on the third block 724 having a plurality of third gas outlets 711. The blocks 720, 722, 724 may be stacked up together with or without any suitable fastening means provided between the first interface 732 and the second interface 734. Alternatively, the injector liner 732E may be formed of two blocks, with the first and second gas outlets 705, 708 provided in the first block and the third gas outlets 711 provided in the second block, where the first block is stack atop the second block (with or without any suitable fastening means provided between an interface 736), as shown in FIG. 7B. It is contemplated that the number of the blocks and/or the number or rows of gas outlets in each block may vary depending on the needs for particular implementations.

Having the injector liner 732E formed in multiple pieces may be advantageous in some cases since each block is interchangeable and may be configured to include various angular and/or zone-controlled configurations as discussed in this disclosure to provide one or more customizable gas flow in accordance with the needs for particular applications. The blocks 720, 722, 724 can be made of any thermally resistant and chemically resistant material such as quartz (either clear quartz or opaque quartz), sapphire, silicon carbide or graphite coated with silicon carbide, or a combination thereof. In some embodiments, each block may be formed of a material different from one another to further enhance the temperature distinction between the gas outlets at different heights. For example, the blocks 720 and 722 may be formed of an opaque quartz and the block 724 may be formed of a clear quartz, a silicon carbide or graphite coated with silicon carbide, or vice versa, depending on the pyrolysis temperature of the precursor gas to be flowed through the gas outlets. In any cases, the temperature of the gas outlets in the injector liner (either formed in an integrated part or multiple pieces) should be high to keep the flow of the precursor gas from re-depositing onto the opening of the gas outlets, but not high enough to crack the precursor gases before entering the processing volume of the process chamber.

Benefits of the present disclosure include an interchangeable side injection with multiple levels of gas outlets to separate two or more precursor gases having different pyrolysis temperature. With multiple levels of gas outlets oriented at different angles, different precursor gases will have substantially the same thermal cracking rate when injecting into the process chamber. The orientation of one or more gas outlets at different heights can be adjusted to flow directional flow of precursor gas(es) towards the center of the substrate, proximate the periphery of the substrate, or spatially distributed on the substrate at any desired location to tune or improve compositional uniformity in the deposited layer or promote a desired flow interaction between different precursor gases. Certain gas outlets at upper level can also be oriented upwardly towards the upper quartz window of the process chamber for cleaning purposes.

While the foregoing is directed to embodiments of the present invention, other and further embodiments of the invention may be devised without departing from the basic scope thereof.

The invention claimed is:

1. A gas injector liner configured for a substrate processing chamber, the gas injector liner comprising:
an inner surface and an outer surface opposing the inner surface, the outer surface extending substantially parallel to the inner surface, the inner surface forming a continuous cylindrical ring configured to face a center of a processing chamber, the gas injector liner further comprising:
a first plurality of gas outlets each having an opening disposed at the inner surface of the gas injector liner at a first height, each opening of the first plurality of gas outlets terminating at the inner surface, wherein a longitudinal axis of one or more of the first plurality of gas outlets is oriented at a first angle with respect to a horizontal plane extending substantially perpendicular to the outer surface, one or more of the first plurality of gas outlets are oriented downwardly towards a bottom of the gas injector liner, and one or more of the first plurality of gas outlets are oriented upwardly towards a top of the gas injector liner;
a first gas channel disposed within the gas injection liner between the inner surface and the outer surface, the first gas channel fluidically coupling the first plurality of gas outlets;
a second plurality of gas outlets each having an opening disposed at the inner surface of the gas injector liner at a second height shorter than the first height, each opening of the second plurality of gas outlets terminating at the inner surface, wherein a longitudinal axis of one or more of the second plurality of gas outlets is oriented downwardly at a second angle with respect to the horizontal plane; and a third plurality of gas outlets each having an opening disposed at the inner surface of the gas injector liner at a third height shorter than the second height, each opening of the third plurality of gas outlets terminating at the inner surface, wherein a longitudinal axis of one or more of the third plurality of gas outlets is oriented at a third angle with respect to the horizontal plane and is substantially parallel to the horizontal plane, wherein an absolute value of the third angle is less than an absolute value of the first angle, wherein one or more of the first plurality of gas outlets, the second plurality of gas outlets, or the third plurality of gas outlets include one or more gas outlets oriented at a fourth angle, and the fourth angle extends between a radius extending relative to a center of the gas injector liner and a line extending in a straight line direction through the respective opening of the one or more gas outlets oriented at the fourth angle, wherein the fourth angle is in the horizontal plane or a plane that is parallel to the horizontal plane, the respective opening of the one or more gas outlets oriented at the fourth angle extends from the inner surface to the outer surface, the fourth angle is within a range of 5 degrees to 35 degrees, and the second plurality of gas outlets are vertically staggered by a half-pitch from the first plurality of gas outlets and the third plurality of gas outlets.

2. The gas injector liner of claim 1, wherein the first angle is in a range of 1° to 35°, and the second angle is in a range of 1° to 35°.

3. The gas injector liner of claim 2, wherein the first angle at which the longitudinal axis of one or more of the first plurality of gas outlets is oriented is different from the second angle at which the longitudinal axis of one or more of the second plurality of gas outlets is oriented.

4. A gas injector liner configured for a substrate processing chamber, the gas injector liner comprising:
an inner surface and an outer surface opposing the inner surface, the outer surface extending substantially parallel to the inner surface, the inner surface forming a continuous cylindrical ring configured to face a center of a processing chamber, the gas injector liner further comprising:
a first plurality of gas outlets each having an opening disposed at the inner surface of the gas injector liner at a first height, each opening of the first plurality of gas outlets terminating at the inner surface, wherein a longitudinal axis of one or more of the first plurality of gas outlets is oriented upwardly towards a top of the gas injector liner and at a first angle with respect to a horizontal plane extending substantially perpendicular to the outer surface, and a longitudinal axis of one or more of the first plurality of gas outlets is oriented downwardly towards a bottom of the gas injector liner and at a second angle with respect to the horizontal plane;
a first gas channel disposed within the gas injection liner between the inner surface and the outer surface, the first gas channel fluidically coupling the first plurality of gas outlets;
a second plurality of gas outlets each having an opening disposed at the inner surface of the gas injector liner at a second height shorter than the first height, each opening of the second plurality of gas outlets terminating at the inner surface, wherein a longitudinal axis of one or more of the second plurality of gas outlets is oriented downwardly at a third angle with respect to the horizontal plane; and a third plurality of gas outlets each having an opening disposed at the inner surface of the gas injector liner at a third height shorter than the second height, each opening of the third plurality of gas outlets terminating at the inner surface, wherein a longitudinal axis of one or more of the third plurality of gas outlets is oriented at a fourth angle with respect to the horizontal plane and is substantially parallel to the horizontal plane, wherein an absolute value of the fourth angle is less than one or more of an absolute value of the first angle or an absolute value of the second angle, wherein one or more of the first plurality of gas outlets, the second plurality of gas outlets, or the third plurality of gas outlets include one or more gas outlets oriented at a fifth angle, and the fifth angle extends between a radius extending relative to a center of the gas injector liner, and a line extending in a straight line direction through the respective opening of the one or more gas outlets oriented at the fifth angle, wherein the fifth angle is in the horizontal plane or a plane that is parallel to the horizontal plane, the respective opening of the one or more gas outlets oriented at the fifth angle extends from the inner surface to the outer surface, the fifth angle is within a range of 5 degrees to 35 degrees, and the second plurality of gas outlets are vertically staggered by a half-pitch from the first plurality of gas outlets and the third plurality of gas outlets.

5. The gas injector liner of claim 4, wherein one or more of the first plurality of gas outlets is coupled to a gas channel, the gas channel having a first passage substantially perpendicular to a second passage, wherein the first passage is fluidically coupled to the second passage.

6. The gas injector liner of claim 1, wherein the gas injector liner is for use in an epitaxial deposition chamber.

7. The gas injector liner of claim 4, wherein the gas injector liner is for use in an epitaxial deposition chamber.

8. The gas injector liner of claim 1, wherein the first plurality of gas outlets are in fluid communication with a first gas source comprising a first group III containing precursor gas, and the second plurality of gas outlets are in fluid communication with a second gas source comprising a second group III containing precursor gas, and the second group III containing precursor gas has thermal decomposition or pyrolysis temperature higher than that of the first group III containing precursor gas.

9. The gas injector liner of claim 4, wherein the first plurality of gas outlets are in fluid communication with a first gas source comprising a first group III containing precursor gas, and the second plurality of gas outlets are in fluid communication with a second gas source comprising a second group III containing precursor gas, and the second group III containing precursor gas has thermal decomposition or pyrolysis temperature higher than that of the first group III containing precursor gas.

10. A gas injector liner configured for a substrate processing chamber, the gas injector liner comprising:

an inner surface and an outer surface opposing the inner surface, the outer surface extending substantially parallel to the inner surface, the inner surface forming a continuous cylindrical ring configured to face a center of the substrate processing chamber, the gas injector liner further comprising:

a first plurality of gas outlets having openings disposed at a first height, each opening of the first plurality of gas outlets terminating at the inner surface, wherein the first plurality of gas outlets are in fluid communication with a first gas source comprising a first group III containing precursor gas, a longitudinal axis of one or more of the first plurality of gas outlets is oriented at a first angle with respect to a horizontal plane extending substantially perpendicular to the outer surface, and one or more of the first plurality of gas outlets are oriented downwardly towards a bottom of the gas injector liner, and one or more of the first plurality of gas outlets are oriented upwardly towards a top of the gas injector liner;

a first gas channel disposed within the gas injection liner between the inner surface and the outer surface, the first gas channel fluidically coupling the first plurality of gas outlets;

a second plurality of gas outlets having openings disposed at a second height shorter than the first height, each opening of the second plurality of gas outlets terminating at the inner surface, wherein the second plurality of gas outlets are in fluid communication with a second gas source comprising a second group III containing precursor gas, the second group III containing precursor gas has thermal decomposition or pyrolysis temperature higher than that of the first group III containing precursor gas, and a longitudinal axis of one or more of the second plurality of gas outlets is oriented downwardly at a second angle with respect to the horizontal plane; and a third plurality of gas outlets having openings disposed at a third height shorter than the second height, each opening of the third plurality of gas outlets terminating at the inner surface, wherein a longitudinal axis of one or more of the third plurality of gas outlets is oriented at a third angle with respect to the horizontal plane and is substantially parallel to the horizontal plane such that a gas, after exiting each of the third plurality of gas outlets, is flowed outwards from the inner surface, wherein an absolute value of the third angle is less than an absolute value of the first angle, wherein one or more of the first plurality of gas outlets, the second plurality of gas outlets, or the third plurality of gas outlets include one or more gas outlets oriented at a fourth angle, and the fourth angle extends between a radius extending relative to a center of the gas injector liner and a line extending in a straight line direction through the respective opening of the one or more gas outlets oriented at the fourth angle, wherein the fourth angle is in the horizontal plane or a plane that is parallel to the horizontal plane, the respective opening of the one or more gas outlets oriented at the fourth angle extends from the inner surface to the outer surface, the fourth angle is within a range of 5 degrees to 35 degrees, and the second plurality of gas outlets are vertically staggered by a half-pitch from the first plurality of gas outlets and the third plurality of gas outlets.

11. The gas injector liner of claim 10, wherein the third plurality of gas outlets are in fluid communication with a third gas source comprising a group V containing precursor gas.

12. The gas injector liner of claim 10, wherein the first gas source and/or the second gas source further comprises an etchant gas.

13. The gas injector liner of claim 1, further comprising:

a second gas channel disposed within the gas injector liner between the inner surface and the outer surface, the second gas channel fluidically coupling the second plurality of gas outlets.

14. The gas injector liner of claim 13, further comprising:

a first gas passage fluidically coupled to the first gas channel; and a second gas passage fluidically coupled to the second gas channel, wherein the first gas passage is configured to flow a plurality of gases.

15. The gas injector liner of claim 4, further comprising:

a second gas channel disposed within the gas injector liner between the inner surface and the outer surface, the second gas channel fluidically coupling the second plurality of gas outlets.

16. The gas injector liner of claim 15, further comprising:

a first gas passage fluidically coupled to the first gas channel; and a second gas passage fluidically coupled to the second gas channel, wherein the first gas passage is configured to flow a plurality of gases.

17. The gas injector liner of claim 10, further comprising:

a second gas channel disposed within the gas injector liner between the inner surface and the outer surface, the second gas channel fluidically coupling the second plurality of gas outlets.

18. The gas injector liner of claim 17, further comprising:

a first gas passage fluidically coupled to the first gas channel; and a second gas passage fluidically coupled to the second gas channel, wherein the first gas passage is configured to flow a plurality of gases.

19. The gas injector liner of claim 1, wherein the fourth angle with respect to the radius is configured to provide a rotational flow of one or more gases that flow in a direction from the outer surface to the inner surface.

20. The gas injector liner of claim 10, wherein the fourth angle with respect to the radius is configured to provide a rotational flow of one or more gases that flow in a direction from the outer surface to the inner surface.

* * * * *